(12) United States Patent
Moriya et al.

(10) Patent No.: US 8,008,980 B2
(45) Date of Patent: Aug. 30, 2011

(54) SURFACE MOUNT TYPE CRYSTAL OSCILLATOR

(75) Inventors: Kouichi Moriya, Saitama (JP);
Tsutomu Yamakawa, Saitama (JP);
Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 144 days.

(21) Appl. No.: 12/584,168

(22) Filed: Sep. 1, 2009

(65) Prior Publication Data

US 2010/0026398 A1 Feb. 4, 2010

Related U.S. Application Data

(62) Division of application No. 11/606,511, filed on Nov. 30, 2006, now Pat. No. 7,602,107.

(30) Foreign Application Priority Data

Nov. 30, 2005 (JP) ................. 2005-346617
Dec. 6, 2005 (JP) ................. 2005-352687
Dec. 19, 2005 (JP) ................. 2005-365328
Mar. 31, 2006 (JP) ................. 2006-100025

(51) Int. Cl.
*H03B 1/00* (2006.01)

(52) U.S. Cl. ............. 331/68; 331/108 C; 331/108 D; 310/348; 310/344

(58) Field of Classification Search ........... 310/348, 310/344, 340, 345, 365–367; 331/68, 108 C, 331/108 D, 158; 29/412, 417, 592.1, 594, 595, 25.35; 438/771; 257/778

See application file for complete search history.

(56) References Cited

U.S. PATENT DOCUMENTS

| | | | | |
|---|---|---|---|---|
| 6,229,249 | B1 * | 5/2001 | Hatanaka et al. | 310/348 |
| 6,229,404 | B1 * | 5/2001 | Hatanaka | 331/68 |
| 6,304,151 | B1 * | 10/2001 | Uehara et al. | 331/108 D |
| 6,445,254 | B1 * | 9/2002 | Shibuya et al. | 331/68 |
| 6,456,168 | B1 * | 9/2002 | Luff | 331/68 |
| 6,559,728 | B1 * | 5/2003 | Fry | 331/69 |
| 6,703,768 | B2 * | 3/2004 | Kageyama et al. | 310/344 |
| 6,777,613 | B2 * | 8/2004 | Okazaki | 174/539 |
| 6,778,029 | B2 * | 8/2004 | Mizusawa | 331/68 |
| 6,833,654 | B2 * | 12/2004 | Rubach | 310/344 |
| 6,998,925 | B2 * | 2/2006 | Harima et al. | 331/68 |
| 7,157,981 | B2 * | 1/2007 | Asamura et al. | 331/108 C |
| 7,242,258 | B2 * | 7/2007 | Hatanaka et al. | 331/68 |
| 2004/0095199 | A1 * | 5/2004 | Ono et al. | 331/158 |
| 2006/0170510 | A1 * | 8/2006 | Moriya | 331/158 |

* cited by examiner

*Primary Examiner* — Chris Chu
(74) *Attorney, Agent, or Firm* — Muirhead and Saturnelli, LLC

(57) ABSTRACT

A surface mount crystal oscillator comprises a crystal blank, an IC chip having an oscillation circuit integrated thereon, and a hermetic package for accommodating the crystal blank and IC chip therein. The hermetic package comprises a substantially rectangular ceramic substrate formed with a metal film which makes a round on one main surface thereof, and a concave metal cover having an open end face bonded to the metal film. The IC chip is secured to the one main surface of the ceramic substrate through ultrasonic thermo-compression bonding using bumps, the crystal blank is disposed above the IC chip, and the ceramic substrate has the one main surface formed as a flat surface.

4 Claims, 10 Drawing Sheets

US 8,008,980 B2

SURFACE MOUNT TYPE CRYSTAL OSCILLATOR

CROSS REFERENCE TO RELATED APPLICATIONS

This application is a divisional of U.S. application Ser. No. 11/606,511 filed Nov. 30, 2006, now U.S. Pat. No. 7,602,107, which is incorporated by reference herein.

BACKGROUND OF THE INVENTION

1. Field of the Invention

The present invention relates to a surface mount type quartz crystal oscillator, and a surface mount type crystal device.

2. Description of the Related Art

Surface mount type crystal oscillators, which have a quartz crystal element and an oscillation circuit using this crystal element, both contained in a surface mount package, are widely used as reference sources for frequency and time in compact portable electronic devices including, among others, portable telephones, because of their small size and light weight. An example of such surface mount type crystal oscillators is disclosed in US 2005/0193548A1.

FIG. 1 is a cross-sectional view illustrating an exemplary configuration a conventional surface mount type crystal oscillator. The surface mount type crystal oscillator has IC (integrated circuit) chip 2 and crystal blank 3 hermetically sealed in package 1. Package 1 comprises ceramic substrate 4 as a mount substrate on which components are mounted, and metal cover 5. Ceramic substrate 4 comprises a laminate of first ceramic layer 4a having a substantially rectangular and flat shape, and second ceramic layer 4b which has a substantially rectangular opening. The opening formed through second ceramic layer 4b defines a recess in one main surface of ceramic substrate 4. On a surface on a laminated side of first ceramic layer 4a, which corresponds to the opening of second ceramic layer 4b, stated another way, on the bottom surface of the recess in ceramic substrate 4, a plurality of circuit terminals 6 are disposed for electric connection with IC chip 2. On the back surface of first ceramic layer 4a, i.e., the outer bottom surface of package 1, mounting electrodes 7 are formed at four corners for use in mounting the crystal oscillator on a wiring board. Each mounting electrode 7 is also provided with an end face electrode 7b, i.e., an area formed to extend to a side surface from the outer bottom surface of first ceramic layer 4a. End face electrode 7b is formed by throughhole processing when ceramic substrate 4 is formed by laminating and burning ceramic sheets. Each mounting electrode 7 is electrically connected to circuit terminal 6 through end face electrode 7b associated therewith, and conductive paths, not shown, formed on laminated surface of first and second ceramic layers 4a, 4b. A soldering fillets are formed on end face electrodes 7b when the crystal oscillator is mounted on the wiring board by reflow soldering.

Sealing metal film 9 is disposed on the top surface of second ceramic layer 4b along the outer periphery thereof. A pair of crystal holding terminals 10 are formed on the top surface of second ceramic layer 4b along one side of the opening at positions corresponding to both ends of the side for holding crystal blank 3. Crystal holding terminals 10 are electrically connected to circuit terminals 6 through conductive paths, not shown, formed on ceramic substrate 4.

As illustrated in FIG. 2, crystal blank 3 is, for example, a substantially rectangular AT-cut quartz crystal blank which is provided with excitation electrodes 13 on both main surfaces thereof, and lead-out electrodes 14 are extended from a pair of excitation electrodes 13 toward opposite ends on one side of crystal blank 3. Both ends of the side of crystal blank 3, to which lead-out electrodes 14 are extended, are secured to crystal holding terminals 10 by conductive adhesive 15 or the like, thereby electrically and mechanically connecting crystal blank 3 to ceramic substrate 4.

IC chip 2, which is substantially rectangular in shape, comprises at least an oscillation circuit, which uses crystal blank 3, integrated on a semiconductor substrate. The oscillation circuit is formed on one main surface of the semiconductor substrate through a general semiconductor device fabrication process. Therefore, a circuit forming surface refers to one of both main surfaces of IC chip 3, on which the oscillation circuit is formed, on the surface of the semiconductor substrate. The circuit forming surface is also formed with a plurality of IC terminals 8 corresponding to the aforementioned circuit terminals 6, as illustrated in FIG. 3. These IC terminals 8 include a power supply terminal, a ground terminal, an oscillation output terminal, a pair of connection terminals for connecting to crystal blank 3, an AFC terminal for receiving an automatic frequency control (AFC) signal, and the like. Then, IC terminals 8 are bonded to circuit terminals 6 through ultrasonic thermo-compression bonding using bumps 12, thereby securing IC chip 2 within the recess of ceramic substrate 4. This also causes the connection terminals of IC chip 2 to electrically connect to crystal holding terminals 10, and the power supply, output, ground, and AFC terminals electrically connected to mounting electrodes 7 associated therewith.

Metal cover 5 is formed in a concave shape, such that its opening end face is bonded to metal film 9 on second ceramic layer 4b, for example, through thermo-compression bonding using brazing metal 11 made, for example, of AuSn (gold-tin) eutectic alloy or the like, thereby bonding metal cover 5 to ceramic substrate 4. In this way, metal cover 5 hermetically seals IC chip 2 placed in the recess of ceramic substrate 4, and crystal blank 3 secured to ceramic substrate 4 within package 1.

In such a surface mount type crystal oscillator, since concave metal cover 5 is bonded to the outer periphery of ceramic substrate 4, the internal volume of package 1 can be made larger, and conversely, the crystal oscillator can be reduced in size while the internal volume of package 1 is maintained constant.

FIG. 4 illustrates a crystal oscillator which employs a flat metal cover. This crystal oscillator employs package body 1 made of laminated ceramics and having a step in a recess, and flat metal cover 5a, where metal cover 5a is bonded to package body 1a to hermetically seal IC chip 2 and crystal blank 3 within the recess. IC chip 2 is secured to the bottom surface of the recess, while crystal blank 3 has its one side secured to the top surface of the step in the recess and is thereby held in the recess. In such a crystal oscillator, from a viewpoint of manufacturing and the like, frame width d2 of the topmost layer of the laminated ceramic layers in package body 1 must be equal to or larger than the height of the layer, thus causing this frame width d2 to be necessarily larger. Frame width d2 is, for example, 0.35 mm. Here, the frame width refers to the distance from an inner wall surface opposing the recess or opening to an outer wall surface in the ceramic layer having a recess or opening. Since crystal blank 3 is surrounded by the topmost layer of the laminated ceramic layers, package body 1a results in having outer dimensions larger than the size of crystal blank 3 further by a factor of two or more of frame width d2 in both of vertical and horizontal directions in the figure. On the other hand, when a concave metal cover as illustrated in FIG. 1 is used, a width needed to bond metal cover 5 to ceramic substrate 4 must only be ensured around crystal blank 3. Typically, this width is equal to thickness d1 of a metal plate which constitutes metal cover 5. This thickness is, for example, 0.08 mm. As such, the configuration illustrated in FIG. 1 can largely increase the internal volume of the package in the same outer dimensions and hence largely reduce the crystal oscillator in outer dimensions, as compared with the configuration illustrated in FIG. 4.

For manufacturing the surface mount type crystal oscillator configured as illustrated in FIG. 1, unburned ceramic sheets (green ceramic sheets) generally having a size corresponding to a plurality of the crystal oscillators are used. The ceramic sheets are then laminated and burned, and then are cut, after burning, into a plurality of ceramic substrates 4 each corresponding to one crystal oscillator. Specifically, as illustrated in FIG. 5A, second ceramic sheet 4B having an opening for each crystal oscillator is laminated on flat first ceramic sheet 4A which has been previously formed with an electrode pattern for each crystal oscillator, and two ceramic sheets 4A, 4B are laminated and burned together, and then are divided along division line X-X to produce individual ceramic substrates 4.

In this event, as illustrated in FIG. 5B in an enlarged view, wedge-shaped division groove 16 is cut into each of both main surfaces of the laminate of the ceramic sheets at the position of the division line, followed by the burning. Such division grooves 16 thus formed facilitate the division of the laminate of the ceramic sheets into ceramic substrates 4 for respective crystal oscillators after the burning. First ceramic sheet 4A corresponds to first ceramic layer 4a, while second ceramic sheet 4B corresponds to second ceramic layer 4b.

However, when the ceramic sheets are baked after they have been formed with division grooves 16 as described above, a contractive force associated with evaporation of a binder from the ceramic sheets concentrates particularly on upper ends of a frame portion defined by second ceramic layer 4b, resulting in external force P exerted in a direction to reduce the area of the opening formed through second ceramic layer 4b. Such external force P thus produced causes first ceramic layer 4a to curve into a concave form in burned ceramic substrate 4. Resulting ceramic substrate 4 suffers from an exacerbated flatness, i.e., plane accuracy on the bottom of the recess.

Assuming here that IC chip 2 is secured to the bottom of the recess in ceramic substrate 4, which is a mounting substrate, i.e., the surface of first ceramic layer 4a, through ultrasonic thermo-compression bonding using bumps 12, sufficient pressure is not applied to bumps 12 on the concave surface which lacks the flatness, as illustrated in FIG. 5C, resulting in a lower strength exerted by bumps 12 for securing IC chip 2 to ceramic substrate 4. Particularly, in this event, those bumps 12 which were not applied with sufficient pressure can compromise electric contacts, and be more susceptible to peeling when an impact is applied thereto. In this connection, the flatness of the bottom surface of the recess in ceramic substrate 4 is preferably in a range of 10 to 15 μm or less.

Further, the surface mount type crystal oscillator configured as illustrated in FIG. 1 also has a problem of difficulties in reducing the manufacturing cost because it is fabricated by laminating second ceramic layer 4b having an opening on flat first ceramic layer 4a. Particularly, since a stamping process is required to form the opening through second ceramic layer 4b, the surface mount type crystal oscillator has a problem of a high processing cost. Another problem lies in that a limited area is merely provided for accommodating IC chip 2 because the surface mount type crystal oscillator receives IC chip 2 within the recess of ceramic substrate 4, and both ends on one side of crystal blank 3 are secured to the position of an edge of the recess. When a temperature compensation mechanism is additionally integrated on the IC chip in addition to the oscillation circuit in order to increase added values of the crystal oscillator, the IC chip is also increased in size. Accordingly, a certain area required on the top surface of ceramic substrate 4 for securing the crystal blank thereto constitutes a factor of impeding a reduction in size of ceramic substrate 4.

Surface mount type crystal devices which have a concave metal cover bonded to a ceramic substrate are not limited to the crystal oscillator described above. Such a concave metal cover bonded to a ceramic substrate can be employed as well in a crystal unit which has a crystal blank encapsulated in a package. Such a surface mount crystal unit is also utilized as a reference source for frequency and time in portable electronic devices.

FIG. 6 illustrates an exemplary configuration of a conventional surface mount type crystal unit. In the illustrated crystal unit, crystal blank 3 similar to that illustrated in FIG. 2 is mounted on flat ceramic substrate 4 which is substantially rectangular in shape, and concave metal cover 5 is bonded to ceramic substrate 4 to hermetically seal crystal blank 3 within a space surrounded by ceramic substrate 4 and metal cover 5. Ceramic substrate 4 may be, for example, in a two-layer structure, where metal film 9 is formed on the top surface of a second layer along the outer periphery thereof. A pair of crystal holding terminals 10 are also disposed on the top surface of the second layer. Mounting electrodes 7c are formed on the bottom surface of ceramic substrate 4, i.e., the lower surface of a first layer for use in mounting the crystal unit on a wiring board. Crystal holding terminals 10 are electrically connected to mounting electrodes 7c through conductive paths formed on laminated surface of the first and second layers, and a conductive film formed on the end face of the first layer. Then, both ends on the one side of crystal blank 3, to which lead-out electrodes 14 extend, are secured to crystal holding terminals 10 with conductive adhesive 16 in a manner similar to the aforementioned.

Metal cover 5 is processed such that an opening end face has a flange, and is bonded to ceramic substrate 4 by thermocompression bonding through the intervention of eutectic alloy 11 such as AuSn alloy or the like between the flange plane and metal film 9. The flange of metal cover 5 is used to increase the width of a portion of metal cover 5 which is bonded to ceramic substrate 4, i.e., a so-called seal-path to ensure the bonding strength and air-tight sealing.

The crystal unit illustrated in FIG. 6 can be manufactured at a reduced cost by virtue of the employment of flat ceramic substrate 4, as compared with a crystal unit (see FIG. 7) which comprises crystal blank 3 placed in a recess of package body 1a, and flat metal cover 5a for closing the recess. In this connection, the crystal unit illustrated in FIG. 7 comprises metal ring 11a for seam welding disposed on the top surface of package body 1a to surround a recess, such that metal cover 5a is bonded to metal ring 11a by seam welding.

In the crystal unit illustrated in FIG. 6, eutectic alloy 10 is melted by heating, with an opening end face of metal cover 5 remaining in contact with eutectic alloy 10, to bond metal cover to ceramic substrate 4. In this event, metal cover 5 is susceptible to shift in position to ceramic substrate 4, where part of the flange of metal cover 5, for example, can protrude from the outer periphery of ceramic substrate 4 to reduce the seal-path, possibly resulting in exacerbated bonding strength and air-tight sealing. Also, with portion of the flange thus protruding from ceramic substrate 4, the resulting crystal unit can experience such problems as a failure in satisfying dimensional criteria related to the external shape, and a defective appearance.

Various problems caused by the shift in position between metal cover 5 and ceramic substrate 4 can also be experienced in the surface mount type crystal oscillator as illustrated in FIG. 1.

SUMMARY OF THE INVENTION

It is an object of the present invention to provide a surface mount type crystal device which facilitates a reduction in size and is manufactured at a lower cost.

It is another object of the present invention to provide a surface mount type crystal device which is capable of increasing a positioning accuracy of a metal cover to a ceramic substrate.

It is a further object of the present invention to provide a surface mount type crystal oscillator which facilitates a reduction in size and is manufactured at a lower cost.

It is a further object of the present invention to provide a surface mount type crystal oscillator which is capable of increasing a positioning accuracy of a metal cover to a ceramic substrate.

It is a further object of the present invention to provide a surface mount type crystal oscillator which excels in the flatness of a ceramic substrate to ensure the boding of an IC chip through ultrasonic thermo-compression bonding using bumps.

According to a first aspect, the present invention provides a surface mount type crystal oscillator which comprises a crystal blank, an IC chip having at least an oscillation circuit using the crystal blank, integrated thereon, and a hermetic package for accommodating the crystal blank and the IC chip therein, wherein the hermetic package comprises a ceramic substrate having a substantially rectangular shape and formed with a metal film which makes a round on one main surface thereof, and a concave metal cover having an open end face bonded to the metal film, the ceramic substrate comprises mounting electrodes at corners on the other main surface thereof for use in mounting the crystal oscillator on a wiring board, the IC chip is secured to the one main surface of the ceramic substrate through ultrasonic thermo-compression bonding using bumps, the crystal blank is disposed above the IC chip, and the one main surface of the ceramic substrate is formed as a flat surface.

In the configuration described above, since the ceramic substrate is substantially flat without recess, the ceramic substrate is prevented from curvature associated with a non-uniform contractive force during burning, thus maintaining the flatness of the ceramic substrate after the burning. As a result, the IC chip can be reliably bonded to the ceramic substrate through ultrasonic thermo-compression bonding using bumps. In such a crystal oscillator, the ceramic substrate may be composed of a first ceramic layer formed with the mounting electrodes, and a second ceramic layer laminated on the first ceramic layer for securing the IC chip thereto, wherein the first ceramic layer may comprise a cutout portion in a central area on at least one side thereof, the cutout portion having an outer periphery open to the side, and an adjustment terminals is formed on a laminated surface of the second ceramic layer exposed by the cutout portion. The adjustment terminal typically includes a write surface terminal used to write temperature compensation data into a temperature compensation mechanism within the IC-chip, and/or a crystal test terminal used to measure oscillation characteristics of the crystal blank.

According to a second aspect, the present invention provides a surface mount type crystal oscillator which comprises a substantially rectangular crystal blank an IC chip having at least an oscillation circuit using the crystal blank, integrated thereon, and a package having at least a substantially rectangular ceramic substrate and adapted to accommodate the crystal blank and the IC chip therein, wherein the ceramic substrate comprises mounting electrodes at corners on a surface thereof which is an outer bottom surface of the package for use in mounting the crystal oscillator on a wiring board, the ceramic substrate comprises a first ceramic layer formed with the mounting electrodes, and a second ceramic layer laminated on the first ceramic layer for securing the IC chip thereto, and the first ceramic layer comprises a cutout portion in a central area on at least one side thereof, where the cutout portion has an outer periphery open to the side, and adjustment terminal is formed on a laminated surface of the second ceramic layer exposed by the cutout portion.

According to this configuration, since a write surface terminal for writing, for example, temperature compensation data is formed in the cutout portion, a probe for writing is more readily accessed to the write surface terminal, as compared with a terminal disposed in a hole formed through a center area of a back surface of a substrate, as shown in Japanese Patent Laid-open application No. 8-307153 (JP, A, 8-307153), by way of example. In this event, the ceramic substrate itself can be made substantially flat, thus making it possible to prevent the ceramic substrate from being curved in association with burning.

Here, the thickness of the first ceramic layer, i.e., a difference in level between the mounting electrodes and adjustment terminals is preferably, for example, in a range of 50 μm to 200 μm, and more preferably in a range of 80 μm to 100 μm.

According to a third aspect, the present invention provides a surface mount type crystal oscillator which comprises a substantially rectangular crystal blank, an IC chip having at least an oscillation circuit using the crystal blank, integrated thereon, and a hermetic package having at least a substantially rectangular ceramic substrate and adapted to accommodate the crystal blank and the IC chip therein, wherein the hermetic package comprises a ceramic substrate having a substantially rectangular shape and formed with a metal film which makes a round on one main surface thereof, and a concave metal cover having an open end face bonded to the metal film, the crystal blank comprises excitation electrodes respectively formed on a pair of main surfaces thereof, and a pair of lead-out electrodes extended from the excitation electrodes to both ends on one side of the crystal blank, the ceramic substrate has at least the one main surface formed as a flat surface, the ceramic substrate comprises mounting electrodes at corners on the other main surface thereof for use in mounting the crystal oscillator on a wiring board, the IC chip has its circuit forming surface secured to the one main surface of the ceramic substrate through ultrasonic thermo-compression bonding using bumps, the crystal blank is held in the hermetic package by securing both ends on the one side thereof to a back surface of the IC chip, and the crystal blank is electrically connected to a relay terminal formed on the one main surface of the ceramic substrate using wire bonding.

According to a fourth aspect, the present invention provides a surface mount crystal device which comprises a crystal blank and a hermetic package for accommodating at least the crystal blank therein, wherein the hermetic package comprises a ceramic substrate having a substantially rectangular shape and formed with a metal film which makes a round on a surface thereof, and a concave metal cover having an open end face bonded to the metal film, and the ceramic substrate includes a step for positioning the metal cover on an inner peripheral side of the metal film on the surface of the ceramic substrate.

Crystal devices of the present invention include, for example, a crystal unit which has a crystal blank placed in a package, and a crystal oscillator which has a crystal element and an oscillation circuit integrated therein.

DETAILED DESCRIPTION OF PREFERRED EMBODIMENTS

Figure 1:
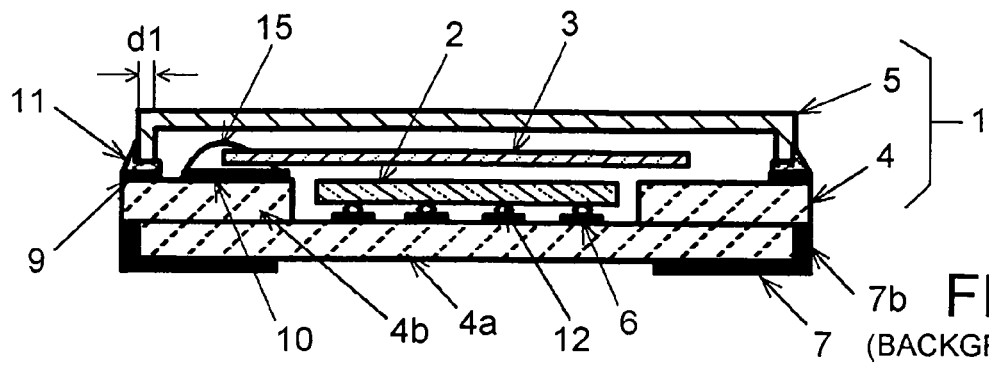
FIG. 1 is a cross-sectional view illustrating an exemplary configuration of a conventional surface mount type crystal oscillator.
Figure 8:
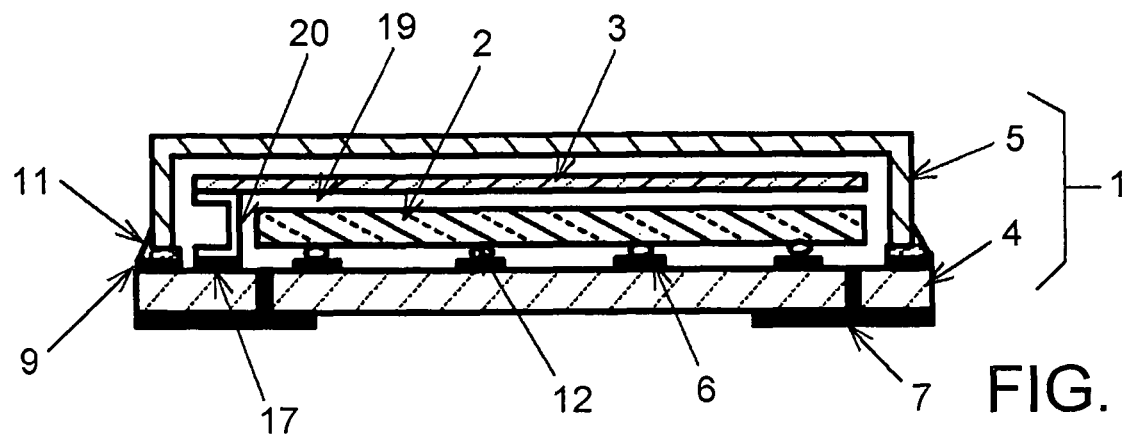
FIG. 8 is a cross-sectional view illustrating the configuration of a surface mount type oscillator according to a first embodiment of the present invention.

In FIG. 8 which illustrates a surface mount type quartz crystal oscillator according to a first embodiment of the present invention, the same components as those in FIG. 1 are designated the same reference numerals as those in FIG. 1.

Figure 2:
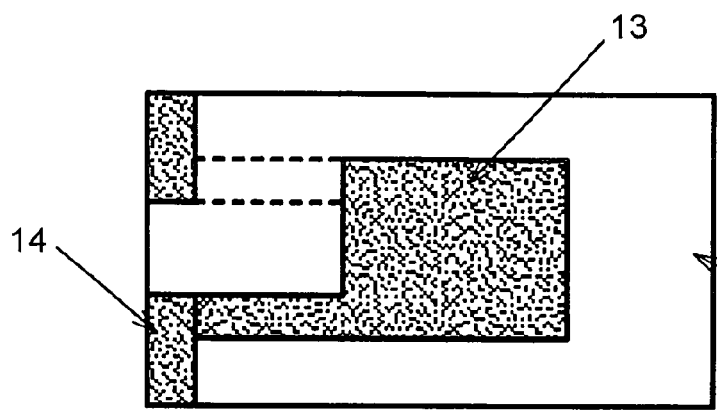
FIG. 2 is a top plan view illustrating a circuit forming surface in an IC (integrated circuit) chip.

The crystal oscillator illustrated in FIG. 8 is similar to that illustrated in FIG. 1 in that concave metal cover 5 is bonded to substantially rectangular ceramic substrate 4 to encapsulate IC chip 2 and quartz crystal blank 3 within hermetic package 1 made up of ceramic substrate 4 and metal cover 5. Metal film 9 is disposed on the top surface of ceramic substrate 4 along the outer periphery thereof, such that metal cover 5 has its opening end face bonded to metal film 9 by brazing metal 11, and is thereby bonded to ceramic substrate 4. Crystal blank 3 used herein is an AT-cut quartz crystal blank similar to that shown in FIG. 3. IC chip 2, which is similar to that shown in FIG. 2, has an oscillation circuit using crystal blank 3, and a temperature compensation mechanism for compensating crystal blank 3 for its temperature-frequency characteristics, both of which are integrated thereon, and also comprises eight IC terminals on its circuit forming surface. The IC terminals include a pair of write terminals for writing temperature compensation data into the temperature compensation mechanism, in addition to the aforementioned power supply terminal, ground terminal, oscillation output terminal, pair of connection terminal, and AFC terminal. Eight circuit terminals 6, later described, are disposed on the top surface of ceramic substrate 4 in correspondence to the IC terminals, such that IC chip 2 is mounted on the top surface of ceramic substrate 4 by bonding the IC terminals to associated circuit terminals 6 through ultrasonic thermo-compression bonding using bumps 12.

The crystal oscillator of the first embodiment differs from the one illustrated in FIG. 1 in that ceramic substrate 4 is not formed with a recess for use in receiving IC chip 2, but has a flat shape. Particularly, one of main surfaces of ceramic substrate 4, on which IC chip 2 is mounted, is flat. Here, flat ceramic substrate 4 is made of a single ceramic layer. Mounting electrodes 7 are formed at four corners on the back surface of ceramic substrate 4 for use in mounting the crystal oscillator on a wiring board. Four mounting electrodes 7 correspond to the power supply, ground, oscillation output, and AFC terminals among the IC terminals, respectively.

This crystal oscillator uses a pair of metal supporters 20 for disposing crystal blank 3 above IC chip 2. Supporters 20 each have a height larger than the thickness of IC chip 2, and is made up of a body extending vertically, and L-shaped members disposed at both ends of the body, respectively. The L-shaped members at one end (i.e., proximal end) and the other end (i.e., distal end) of supporter 20 have their leading ends extending in the same direction. The L-shaped member at the proximal end has a side surface bonded to relay terminal 17 formed on the top surface of ceramic substrate 4. The upper end side of supporter 20 protrudes upward from the top surface of IC chip 2. Substantially rectangular crystal blank 3 is horizontally held above IC chip 2 by securing a pair of lead-out electrodes extending from both ends on one side of crystal blank 3 to side surfaces of the L-shaped members at the distal ends of the pair of supporters 20 with a conductive adhesive (not shown) in such a manner that the longitudinal direction of crystal blank 3 matches the longitudinal direction of ceramic substrate 4. Here, crystal blank 3 has a length larger than the length of IC chip 2 in the same direction, so that IC chip 2 is completely covered with crystal blank 3. Of course, crystal blank 3 can be formed smaller than IC chip 2, but larger crystal blank 3 results in a larger plate area which facilitates the designing for accomplishing desired oscillation characteristics.

Figure 9:
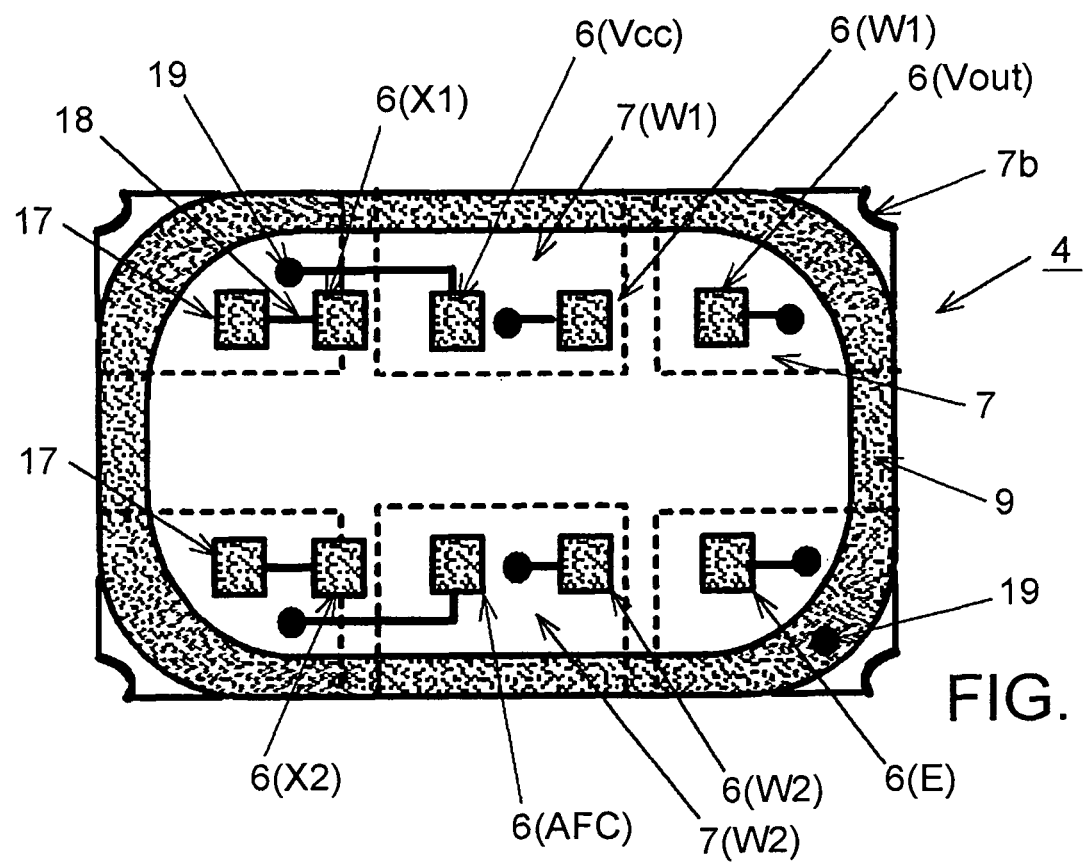
FIG. 9 is a top plan view of a ceramic substrate in the crystal oscillator illustrated in FIG. 8.

FIG. 9 illustrates the top surface of ceramic substrate 4. Metal film 9, which is formed along each side of substantially rectangular ceramic substrate 4, is formed closer to the center of ceramic substrate 4 in the four corner portions of ceramic substrate 4 such that metal film 9 traces circular arcs at the corner portions. Then, at the four corners, end face electrodes 7b are formed on the side surfaces of ceramic substrate 4 by through-hole processing. End face electrodes 7b are disposed integrally with associated mounting electrodes 7.

As described above, circuit terminals 6 and a pair of relay terminals 17 are formed on the top surface of ceramic substrate 4. On illustrated ceramic substrate 4, a total of eight circuit terminals 6 are disposed, four along each of the long sides of ceramic substrate 4. These circuit terminals, which correspond to the IC terminals of IC chip 2, include a pair of connection terminals 6(X1), 6(X2) for connection to crystal blank 3, power supply terminal 6(Vcc), oscillation output terminal 6(Vout), ground terminal 6(E), AFC terminal 6(AFC), and a pair of write terminals 6(W1), 6(W2) for writing temperature compensation data. Among these circuit terminals, connection terminals 6(X1), 6(X2) are electrically connected to relay terminals 17 through conductive paths formed on the surface of ceramic substrate 4. Power supply terminal 6(Vcc), oscillation output terminal 6(Vout), ground terminal 6(E), and AFC terminal 6(AFC) are connected to corresponding mounting electrodes 7 through conductive paths formed on the surface of ceramic substrate 4 and via-holes 19 extending through ceramic substrate 4, respectively.

Write surface terminals 7(W1), 7(W2) are disposed on the back surface of ceramic substrate 4, other than the aforementioned mounting electrodes 7, for electric connection to write terminals 6(W1), 6(W2), respectively. In FIG. 9, the mounting electrodes and write surface electrodes are formed at positions indicated by broken lines. Each of write surface terminals 7(W1), 7(W2) is placed at the center between mounting electrodes 7, which are disposed at both ends on a long side of ceramic substrate 4, along the long side. A probe for writing data is accessed to write surface terminals 7(W1), 7(W2) for writing temperature compensation data into the temperature compensation mechanism within IC chip 2. Write surface terminals 7(W1), 7(W2) are electrically connected to corresponding write terminals 6(W1), 6(W2), respectively, through conductive paths routed on the surface of ceramic substrate 4 and via-holes 19 extending through ceramic substrate 4. Further, for setting metal cover 5 at a ground potential, metal film 9 on ceramic substrate 4 is also electrically connected to mounting electrode 7 corresponding to the ground terminal through via-hole 19. In this way, so-called case grounding is performed.

Ceramic substrate 4 is formed by burning a green ceramic sheet (i.e., unburned ceramic sheet). Via-holes 19 are formed by providing through-holes through the green ceramic sheet, filling the through-holes with a printing material, and disposing a plating layer on a circuit pattern after burning when a circuit underlying pattern (i.e., circuit terminals 6, relay terminals 17, conductive paths 18, and mounting electrodes 7) is formed on the ceramic sheet by printing. The printing material used herein may be, for example, molybdenum (Mo) or tungsten (W). The plating layer is formed by laminating a nickel (Ni) layer and a gold (Au) layer. By forming the plating layer after the burning, via-holes 19 are completed, and in this event, the through-holes are closed to maintain hermetic package 1 in an air-tight state.

In this crystal oscillator, ceramic substrate 4 has both main surfaces formed flat, and is therefore free from a problem of non-uniform contraction which would be otherwise experienced when a second ceramic layer having an opening is laminated on a flat first ceramic layer, and the resulting laminate is burned. Consequently, in this embodiment, ceramic substrate 4 remains flat even after burning, without being curved. Thus, when IC chip 2 is secured to ceramic substrate 4 through ultrasonic thermo-compression bonding using bumps 12, the IC terminals and circuit terminals 6 establish secure electric connections therebetween. The use of concave metal cover 5 facilitates a reduction in size of the surface mount type crystal oscillator, as is the case with the conventional one illustrated in FIG. 1. Also, since ceramic substrates can be formed of a single ceramic layer, the manufacturing cost can be reduced.

It should be noted that write surface terminals 7(W1), 7(W2) disposed on the bottom surface of ceramic substrate 4 can be used as mounting electrodes as required in order to enhance a connection strength to a wiring board.

Next, a surface mount type crystal oscillator according to a second embodiment of the present invention will be described with reference to FIGS. 10 to 12.

In the crystal oscillator illustrated in FIG. 8, the mounting electrodes and surface write terminals are disposed at the same level on the back surface of ceramic substrate 4. In such a configuration, the surface write terminals can be used for mounting like the mounting electrodes, whereas a circuit pattern on a wiring board can unintentionally come into electric contact with the surface write terminals. To avoid such unintentional electric contacts, the crystal oscillator of the second embodiment has surface write terminals 7(W1), 7(W2) formed in associated dimples, as illustrated in FIG. 10, such that mounting electrodes 7 are different in level from surface write terminals 7(W1), 7(W2), more specifically, such that mounting electrodes 7 come into contact with a wiring board, but surface write terminals 7(W1), 7(W2) do not come into contact with the wiring board when the crystal oscillator is carried on the wiring board.

Figure 10:
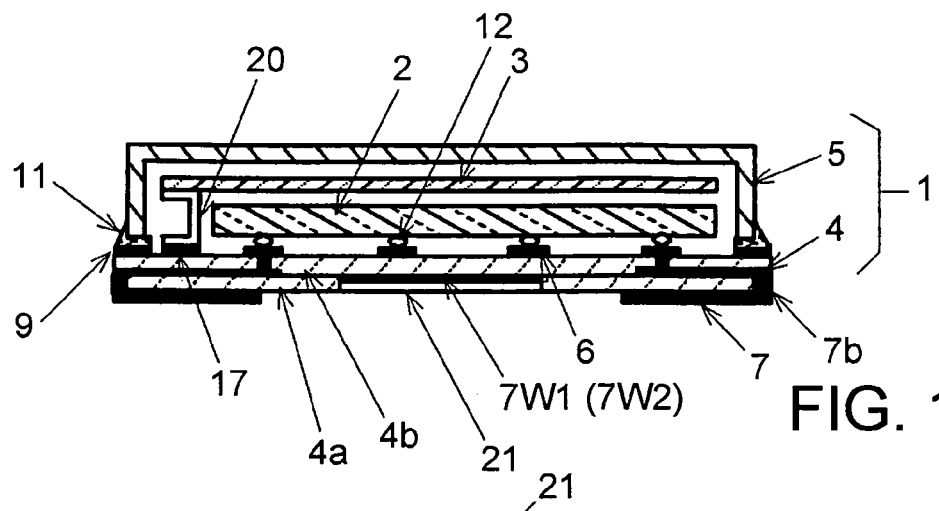
FIG. 10 is a cross-sectional view illustrating a surface mount type crystal oscillator according to a second embodiment of the present invention.
Figure 11:
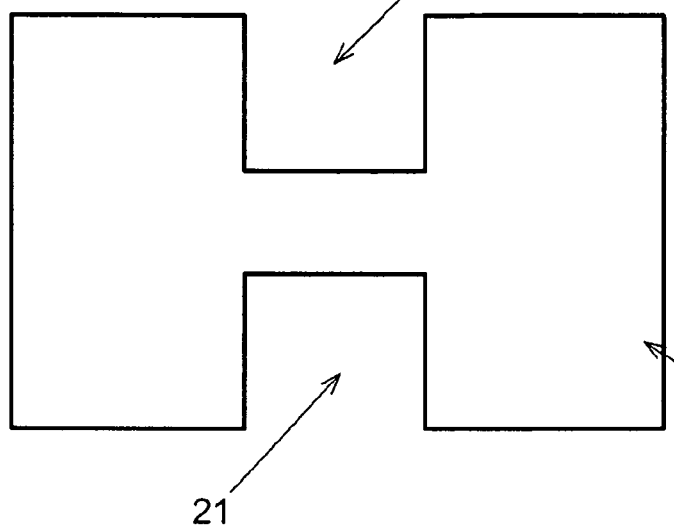
FIG. 11 is a top plan view of a first ceramic layer in the crystal oscillator illustrated in FIG. 10.

As illustrated in FIG. 10, the crystal oscillator of the second embodiment is similar to the crystal oscillator of the first embodiment illustrated in FIG. 8, but differs from the first embodiment in that substantially rectangular ceramic substrate 4 is made of a laminated ceramic substrate composed of first ceramic layer 4a and second ceramic layer 4b, and cutout portions 21 are defined in first ceramic layer 4a which is placed on the bottom side.

Specifically, second ceramic layer 4b has a flat top surface on which circuit terminals 6, metal film 9, and relay terminals 17 are formed. Mounting electrodes 7 are formed at four corners on the back surface of first ceramic layer 4a. Then, as illustrated in FIG. 11, cutout portions 21 are defined in substantially rectangular areas along the respective long sides of first ceramic layer 4a. Surface write terminals 7(W1), 7(W2) are formed on the back surface of second ceramic layer 4b, i.e., on the surface of second ceramic layer 4b which is laminated on first ceramic layer 4a, at the positions of cutout positions 21 in first ceramic layer 4a. Since there is not first ceramic layer 4a in cutout portions 21, ceramic substrate 4 composed of first ceramic layer 4a and second ceramic layer 4b laminated thereon causes surface write terminals 7(W1), 7(W2) on second ceramic layer 4b to expose at the positions of cutout portions 21, as illustrated in FIG. 12, when viewed from the back side.

Figure 12:
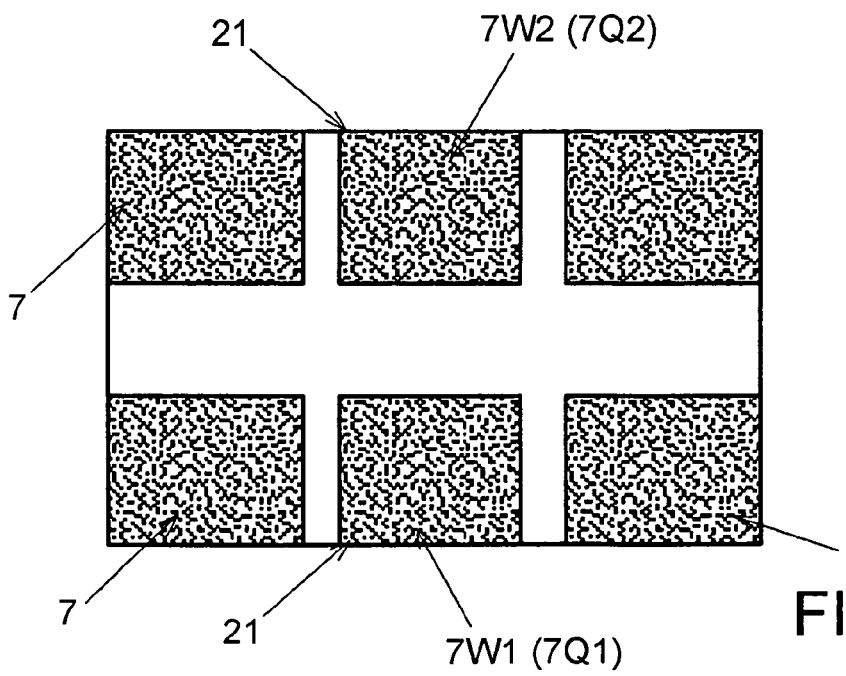
FIG. 12 is a bottom view of the crystal oscillator illustrated in FIG. 10.

It should be noted that end face electrodes 7b are disposed at four corners of first ceramic layer 4a on end faces of first ceramic layer 4a in a manner similar to the foregoing, but illustration of end face electrodes 7b is omitted in FIG. 12 for convenience.

Mounting electrodes 7 at the four corners are electrically connected to power supply terminal 6(Vcc), output terminal 6(Vout), ground terminal 6(E), and AFC terminal 6(AFC) disposed on the top surface of second ceramic layer 4b, respectively, through via-holes and conductive paths routed on the laminated surface. Likewise, write surface terminals 7(W1), 7(W2) are electrically connected to write terminals 6(W1), 6(W2), respectively, through via-holes and conductive paths.

In the configuration as described above, even though cutout portions 21 are formed in central areas of both sides of first ceramic layer 4a, cutout portions 21 have a smaller area than the opening formed through the second ceramic layer of the conventional crystal oscillator illustrated in FIG. 1, and are positioned along the outer periphery of first ceramic layer 4a, so that even if an external force acts due to a contractive force during burning, the contractive force merely exerts a small influence on general curvature of ceramic substrate 4. In other words; even such cutout portions would not lead to curvature of the ceramic substrate. Accordingly, electric connections are established between the IC terminals and circuit terminals 6 without fail when IC chip 2 is secured to ceramic substrate 4 through ultrasonic thermo-compression bonding using bumps 12, in a manner similar to the first embodiment. In this embodiment, first ceramic layer 4a has a thickness of 50 to 200 mm, for example, and preferably 80 to 100 μm.

In the second embodiment, since write surface terminals 7(W1), 7(W2) are formed in dimples defined by cutout portions 21, write surface terminals 7(W1), 7(W2) are prevented from coming into contact with a wiring pattern on a wiring board when this crystal oscillator is mounted on the wiring board. Also, sine write surface terminals 7(W1), 7(W2) are disposed in cutout portions 21 formed along the outer periphery of ceramic substrate 4, a probe for writing temperature compensation data can be more readily accessed to write surface terminals 7(W1), 7(W2) than when write-surface terminals 7(W1), 7(W2) are disposed in a recess formed in a central area of a substrate, thus leading to improved operability.

In this embodiment, write surface terminals 7(W1), 7(W2) for writing temperature compensation data are placed in correspondence to cutout portions 21 in first ceramic layer 4a, but write surface terminals 7(W1), 7(W2) may be replaced with a pair of crystal test terminals 7Q1, 7Q2 which are electrically connected to a pair of relay terminals 17 through conductive paths, not shown. The use of crystal test terminals 7Q1, 7Q2 permits the electric characteristics and oscillation characteristics of crystal blank 3, as a crystal element, to be independently measured from another circuit even after crystal blank 3 is encapsulated in hermetic package 1. When a single write terminal is provided in IC chip 2, cutout portion 21 is only required along one long side of first ceramic layer 4a, as a matter of course.

Next, a description will be given of a surface mount type crystal oscillator according to a third embodiment of the present invention. While the crystal oscillator of the second embodiment comprises two write surface terminals, three or more write surface terminals may be required depending on the configuration of IC chip 2, or some IC chips are preferably provided with both write surface terminals and crystal test terminals. The crystal oscillator of the third embodiment can be provided with up to four write surface terminals and/or crystal test terminals in combination.

Figure 13:
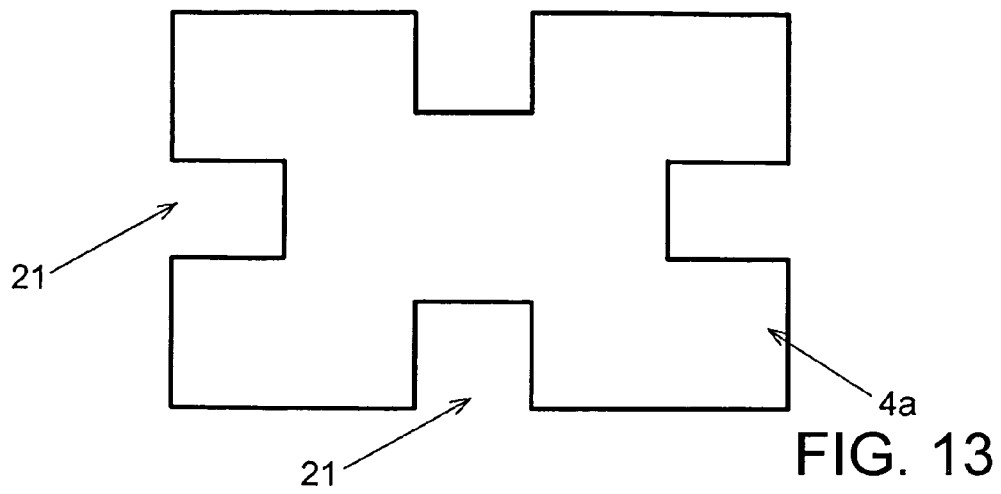
FIG. 13 is a top plan view of a first ceramic layer in a surface mount type crystal oscillator according to a third embodiment of the present invention.

The crystal oscillator of the third embodiment is similar to the crystal oscillator of the second embodiment but differs in the position of cutout portions in first ceramic layer 4a. As illustrated in FIG. 13, first ceramic layer 4a used in the crystal oscillator of the third embodiment is formed with substantially rectangular cutout portions 21 in central areas along respective sides of first ceramic layer 4a. These cutout portions 21 are all positioned between mounting electrodes 7.

Figure 14A:
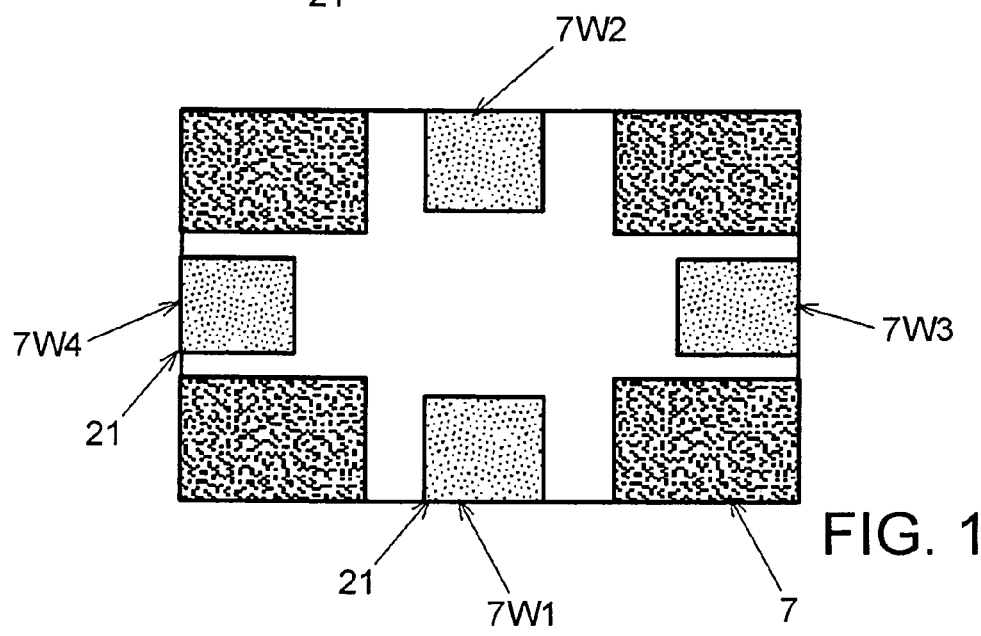
FIGS. 14A and 14B are bottom views each illustrating an exemplary placement of terminals in the crystal oscillator of the third embodiment.
Figure 14B:
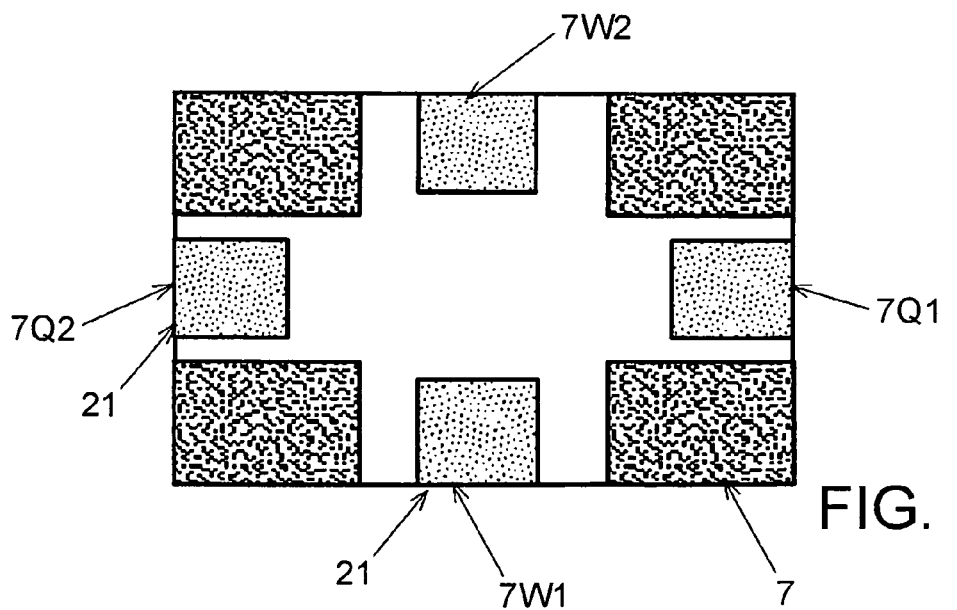

By thus forming four cutout portions 21, it is possible to provide a total of four write surface terminals and/or crystal test terminals in combination. Then, as illustrated in FIG. 14A, four write surface terminals 7(W1) to 7(W4) can be formed on the surface of second ceramic layer 4b exposed through cutout portions 21. According to this configuration, it is possible to use IC chip 2 which requires four write terminals. Alternatively, as illustrated in FIG. 14B, write surface terminals 7(W1), 7(W2) can be disposed in cutout portions 21 associated with one set of two opposing sides, while crystal test terminals 7Q1, 7Q2 can be disposed in cutout portions 21 associated with the other set of two opposing sides. In this way, since both the write surface terminals and crystal test terminals can be formed on the bottom surface of ceramic substrate 4, the same measuring tools can be conveniently used by way of example.

The third embodiment is similar to the first and second embodiments in that cutout portions 21 are formed in an outer peripheral area of first ceramic layer 4a, and IC chip 2 is mounted on a flat central area, so that ceramic substrate 4 is prevented from being curved even if a contractive force acts thereon during burning. Also, since the cutout portions are located symmetrically about the center line of ceramic substrate 4, no excessive stress will act on ceramic substrate 4.

Figure 4:
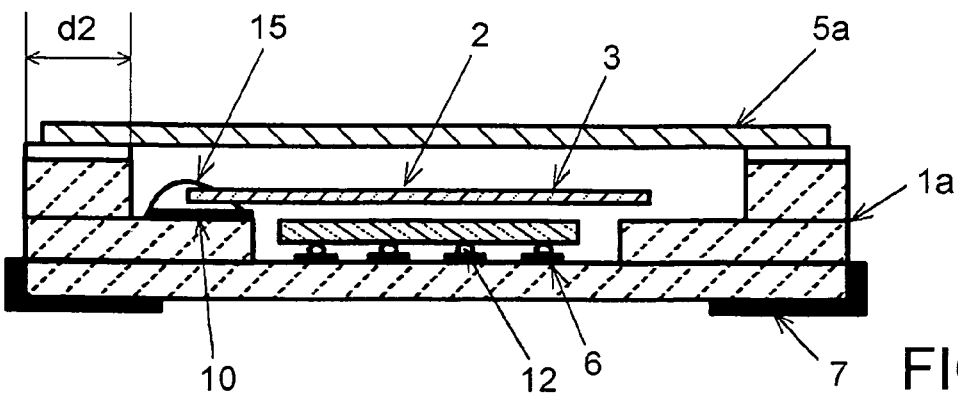
FIG. 4 is a cross-sectional view illustrating another example of a conventional surface mount type crystal oscillator.
Figure 5A:
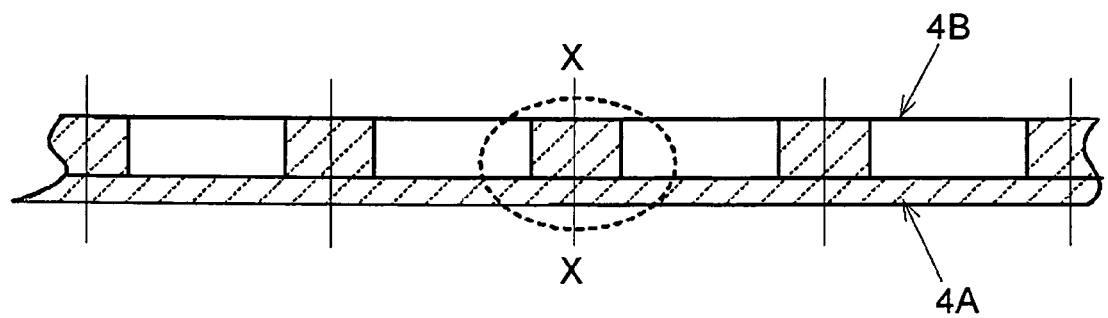
FIG. 5A is a cross-sectional view of unburned ceramic sheets.
Figure 5B:
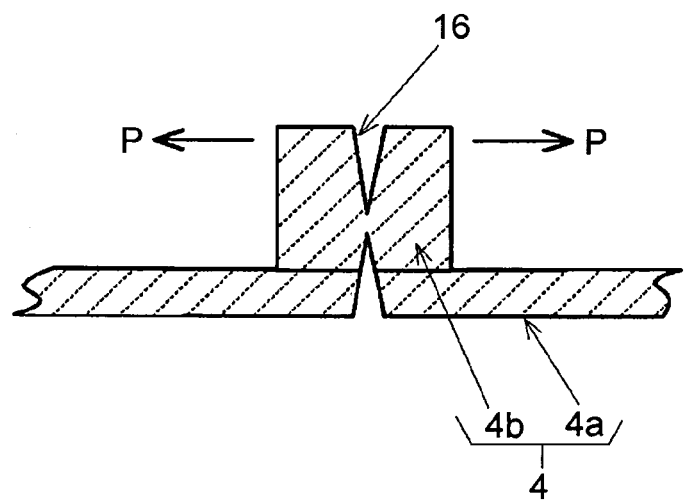
FIG. 5B is a partially enlarged cross-sectional view of a portion surrounded by a circle in FIG. 5A.
Figure 5C:
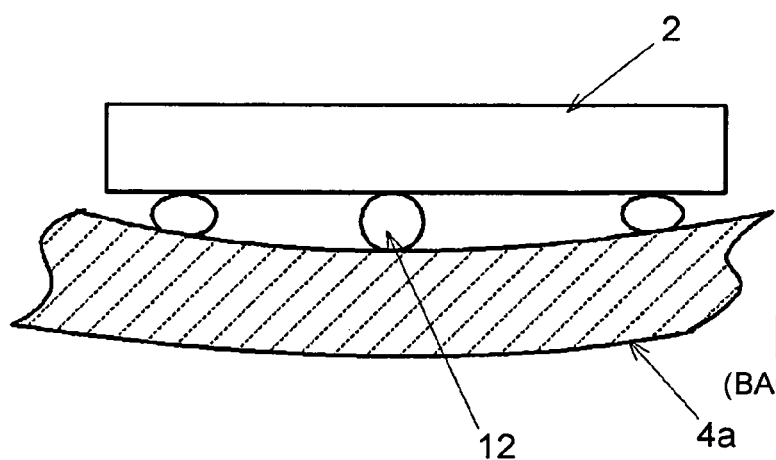
FIG. 5C is a cross-sectional view illustrating ceramic layers on which an IC chip is mounted.
Figure 15:
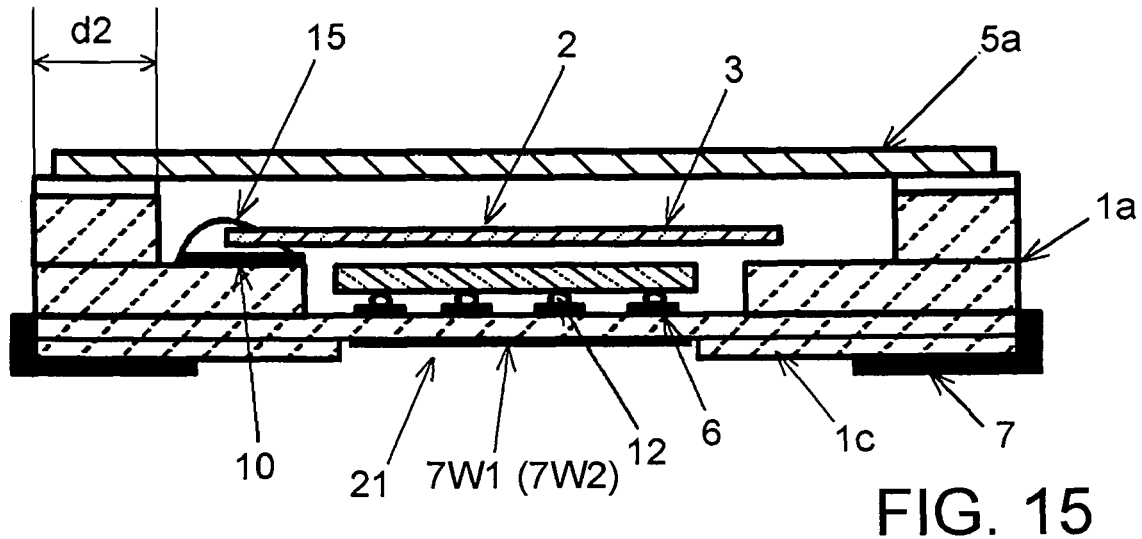
FIG. 15 is a cross-sectional view illustrating the configuration of a surface mount type crystal oscillator according to a fourth embodiment of the present invention.

Next, a description will be given of a surface mount type crystal oscillator according to a fourth embodiment of the present invention. In the surface mount type crystal oscillators of the second and third embodiments, a step is formed on the back surface of ceramic substrate 4 and the mounting electrodes and write surface terminals are disposed with the step intervening therebetween. Such a configuration can be also applied to the conventional crystal oscillator illustrated in FIG. 4. FIG. 15 illustrates the crystal oscillator illustrated in FIG. 4 which is additionally provided with a step formed on the bottom surface of package-body 1a made of laminated ceramic layers and comprises mounting electrodes 7 and write surface terminals 7(W1), 7(W2) disposed with the step intervening therebetween. In the illustrated crystal oscillator, among ceramic layers which make up package body 1a, lowermost ceramic layer 1c, as viewed in the figure, is formed with cutout portions 21, such that write surface terminals 7(W1), 7(W2) are disposed on a surface which is exposed through cutout portions 21.

Next, a description will be given of a surface mount type crystal oscillator according to a fifth embodiment of the present invention. The crystal oscillator of the fifth embodiment illustrated in FIG. 16 is similar to the first embodiment illustrated in FIG. 8, but differs in a method of holding crystal blank 3 in hermetic package 1.

Figure 3:
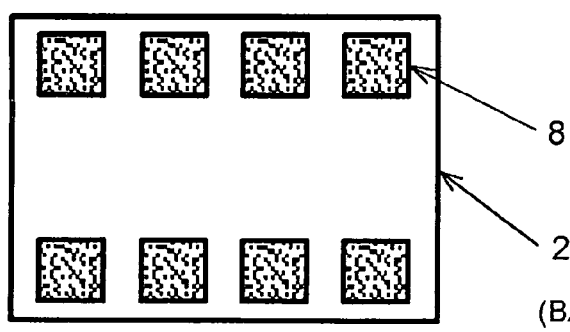
FIG. 3 is a top plan view illustrating an exemplary configuration of a crystal blank.
Figure 16:
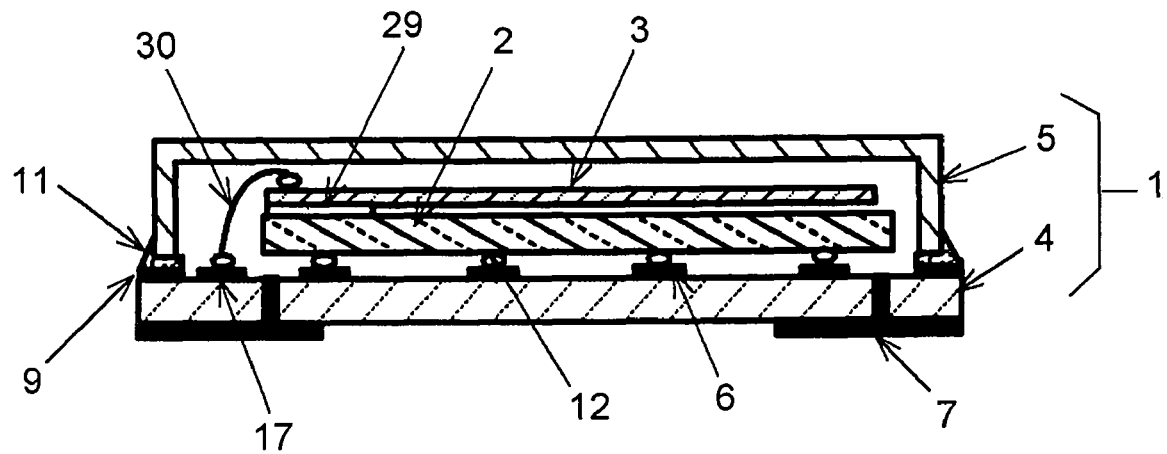
FIG. 16 is a cross-sectional view illustrating the configuration of a surface mount type crystal oscillator according to a fifth embodiment of the present invention.

In the crystal oscillator illustrated in FIG. 16, IC chip 2, which is the same as that in the first embodiment, is secured to the top surface of ceramic substrate 4 through ultrasonic thermo-compression bonding using bumps 12 by bonding IC terminals of IC chip 2 to circuit terminals 6 formed on the top surface of ceramic substrate 4. Circuit terminals 6, metal film 9, and relay terminals 17 on ceramic substrate 4 are identical in position to those illustrated in FIG. 9. Crystal blank 3 is an AT-cut quartz crystal blank as shown in FIG. 3. The crystal blank is held by the supporters in the first embodiment, whereas in the fifth embodiment, crystal blank 3 is held in hermetic package 1 by securing one side of crystal blank 3, from which lead-out electrodes 14 are extended, to the back surface (i.e., a main surface opposite to the circuit forming surface) of IC chip 2 through insulating adhesive 29, In other words, insulating adhesive 29 intervenes between an end region of the main surface of crystal blank 3 opposing IC chip 2 and IC chip 2. Then, relay terminals 17 disposed on the top surface of ceramic substrate 4 are electrically connected to lead-out electrodes 14 on the top surface of crystal blank 3, as viewed in FIG. 16, by wire bonding using gold wires 30. In this crystal oscillator, crystal blank 3 has a longitudinal length shorter than the length of IC chip 3 in the same direction, such that a leading portion of crystal blank 3 does not protrude outward from the outer peripheral contour of IC chip 2. The remaining aspects of the crystal oscillator of the fifth embodiment are the same as the crystal oscillator of the first embodiment.

Like the first embodiment, the crystal oscillator of the fifth embodiment can be manufactured at a reduced cost by virtue of the use of a ceramic substrate made of a single layer. Then, since crystal blank 3 is directly secured on IC chip 2, no step is needed to be formed in the ceramic substrate for holding crystal blank 3, so that ceramic substrate 4 can be reduced in size, as compared with the conventional one illustrated in FIG. 1. Stated another way, a ceramic substrate of the same size can provide a larger internal volume which can be effectively utilized within hermetic package 1. For example, the distance from one end of IC chip 2 to the inner peripheral surface of metal cover 5 can be reduced to approximately 0.3 mm. On the other hand, in the conventional crystal oscillator illustrated in FIG. 1, a length of approximately 0.4 mm is required for the step because an area is required for applying an adhesive, and a gap of approximately 15 mm is additionally required for mounting IC chip 2 in the recess. Thus, from the fact that the conventional crystal oscillator requires approximately 0.55 mm extra, the length of ceramic substrate 4 can be reduced by 0.25 mm in this embodiment, as compared with the one illustrated in FIG. 1.

Also, since crystal blank 3 has its one side directly secured on IC chip 2 with insulating adhesive 29 so that IC chip 2 additionally serves as a holder for crystal blank 3, the number of parts can be reduced.

While crystal blank 3 is horizontally placed in the crystal oscillator illustrated in FIG. 16, crystal blank 3 may be inclined upward toward the opposite side thereof to prevent crystal blank 3 from coming into contact with IC chip 2. In this event, as long as the opposite side of crystal blank 3 rises up by a height approximately equal to a loop of gold wire 30 used for wire bonding, the crystal oscillator can maintain a low profile.

Figure 17A:
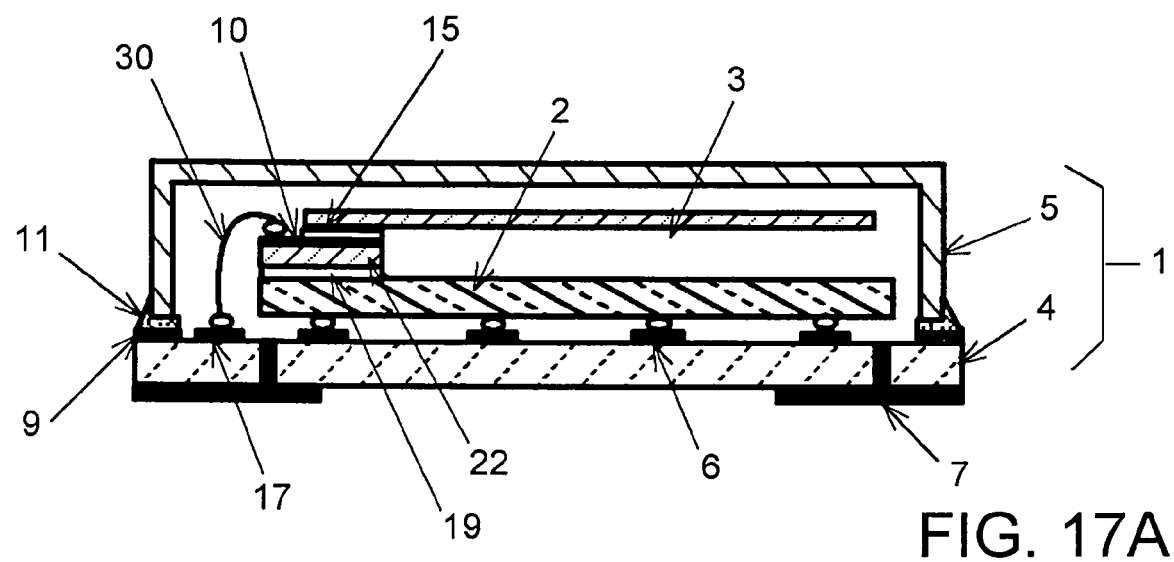
FIG. 17A is a cross-sectional view illustrating the configuration of a surface mount type crystal oscillator according to a sixth embodiment of the present invention.
Figure 17B:
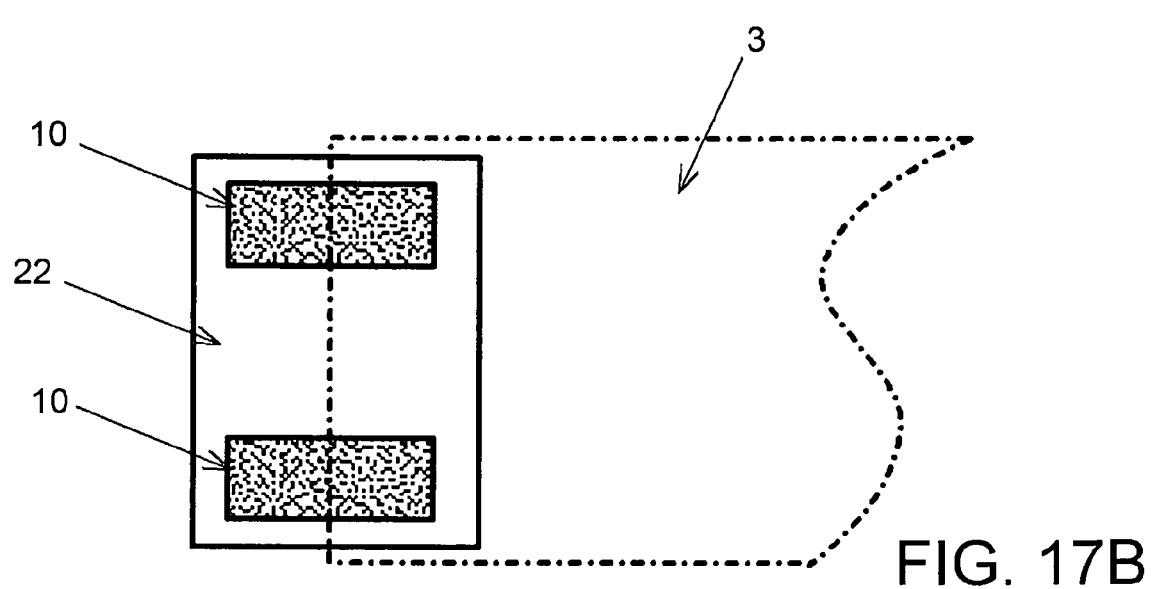
FIG. 17B is a top plan view illustrating an auxiliary substrate.

Next, a description will be given of a surface mount type crystal oscillator according to a sixth embodiment of the present invention. In the fifth embodiment described above, crystal blank 3 is directly secured to IC chip 2 with an insulating adhesive, whereas in the crystal oscillator of the sixth embodiment illustrated in FIG. 17A, crystal blank 3 is mounted on IC chip 2 through the intervention of auxiliary substrate 22. The rest of the configuration in the sixth embodiment is the same as the fifth embodiment. Auxiliary substrate 22 is made, for example, of a crystal plate having the same cutting angle (i.e., AT-cut) as crystal blank 3, and is provided with a pair of crystal holding terminals 10 on one main surface thereof. Auxiliary substrate 22 is secured to the back surface of IC chip 2 with insulating adhesive 29, while crystal blank 3 is secured to auxiliary substrate 22 with conductive adhesive 15. FIG. 17B illustrates a positional relationship between auxiliary substrate 22 and crystal blank 3. A pair of crystal holding terminals 10 are electrically connected to a pair of relay terminals 17 on ceramic substrate 4 by wire bonding using gold wires 30.

A description will now be given of processes of manufacturing the crystal oscillator as described above. First, IC chip 2 is secured on ceramic substrate 4 through ultrasonic thermo-compression bonding similar to the foregoing, and auxiliary substrate 21 is secured on IC chip 2 with insulating adhesive 19. Next, both ends on one side of crystal blank 3, from which lead-out electrodes 14 extend, are secured to given end areas of crystal holding terminals 10 on auxiliary substrate 22 with conductive adhesive 15. Finally, opposite end areas of crystal holding terminals 10 are connected to relay terminals 17 on ceramic substrate 4 with gold wires 30 for wire bonding, and the opening end face of metal cover 5 is bonded to metal film 9 disposed around the outer periphery of ceramic substrate 4 through thermo-compression bonding using brazing metal 11 for sealing.

In the foregoing configuration, auxiliary substrate 22 is entirely secured on IC chip 2 and is therefore mechanically stable, thus facilitating wire bonding operations for connecting crystal holding terminals 10 to relay terminals 17. The intervening auxiliary substrate 21 causes a relatively large gap between crystal blank 3 and IC chip 2 to facilitate securing operations and the like and to prevent crystal blank 3 from coming into contact with IC chip 2 to maintain good oscillation characteristics. Since auxiliary substrate 22 is made of a crystal plate having the same cutting angle (i.e., AT-cut) as crystal blank 3, auxiliary substrate 22 and crystal blank 3 have the same coefficient of thermal expansion, thus eliminating distortions due to a difference in the coefficient of thermal expansion. Consequently, the crystal element (crystal blank 3) is improved in thermal shock resistance characteristics.

Since the sixth embodiment also employs ceramic substrate 4 made of a single layer, as is the case with the fifth embodiment, the crystal oscillator can be manufactured at a reduced cost. Also, since no step is needed to be formed in the ceramic substrate for holding the crystal blank, ceramic substrate 4 can be reduced in length to increase the effective internal volume of sealed package 1.

In the fifth and sixth embodiments described above, ceramic substrate 4 is made of a single layer, but alternatively may be made of laminated ceramics. In this event, since green ceramic sheets need not be stamped, the manufacturing cost can be restrained from increasing. When laminated ceramics are used, conductive paths can be formed on laminated surface for electrically connecting IC chip 2 to mounting electrodes 7 to ensure the air-tight sealing of the hermetic package. When a temperature compensated crystal oscillator is implemented, ceramic substrate 4 may be formed with terminals for writing temperature compensation data, terminals for testing characteristics of a crystal element, and the like on side surfaces thereof. Electrode patterns for write terminals and characteristic test terminals may not be formed on a lowermost ceramic layer and an uppermost ceramic layer to prevent these terminals from electrically shorting, for example, with a conductor pattern on a wiring board.

In the first to sixth embodiments described above, end face electrodes 7b may not be disposed at four corners of ceramic substrate 4 by through-hole processing, such that metal film 9 is formed correspondingly closer to the edges of ceramic substrate 4 to increase the substantial internal volume of hermetic package 1. Metal film 9 may be slightly spaced apart from the side edges of ceramic substrate 4 in order to facilitate a process of dividing burned laminate of ceramic sheets into individual ceramic substrates 4. Also, in each of the embodiments described above, the crystal oscillator has been described to be a temperature compensated crystal oscillator into which temperature compensation data is written from the outside, the crystal oscillator may be an SPXO (simple packaged crystal oscillator) which is not equipped with the temperature compensation mechanism. Further, crystal blank 3 disposed above IC chip 2 has a free end from which lead-out electrodes 14 do not extend, so that an impact, if applied, would cause the free end to collide with the back surface of IC chip 2, possibly resulting in deteriorated oscillation characteristics. Accordingly, a flexible adhesive may be applied to the back surface of IC chip 2 or to the inner surface of metal cover 5, corresponding to the free end of crystal blank 3, so as to reduce a width over which crystal blank 3 swings when an impact is applied thereto.

Figure 18A:
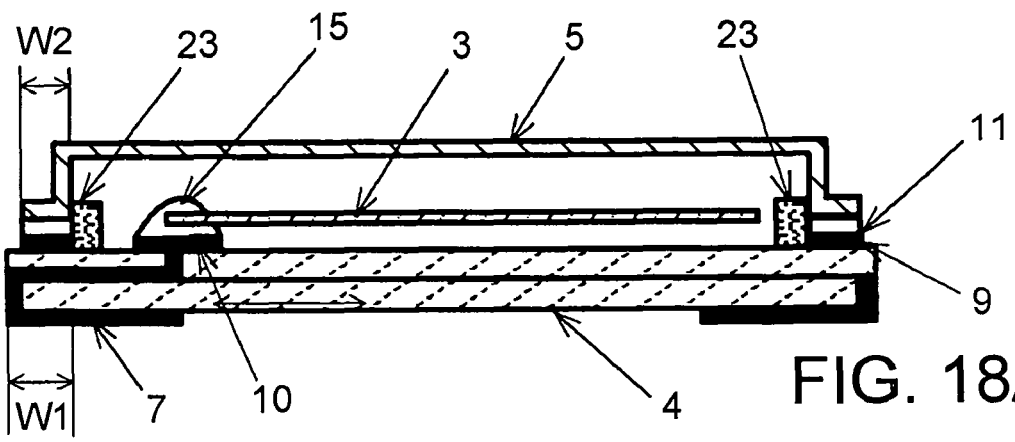
FIGS. 18A to 18C are cross-sectional views each illustrating a surface mount type crystal unit based on the present invention.

Next, a description will be given of crystal devices according to the present invention. FIG. 18A is a cross-sectional view illustrating the configuration of a surface mount type crystal unit which is an example of crystal devises according to the present invention.

Figure 6:
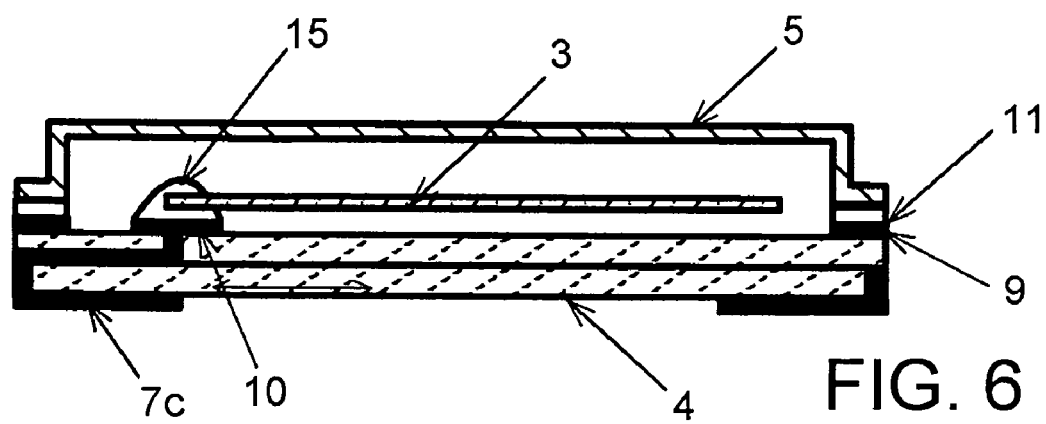
FIG. 6 is a cross-sectional view illustrating an exemplary configuration of a conventional surface mount type crystal unit.
Figure 7:
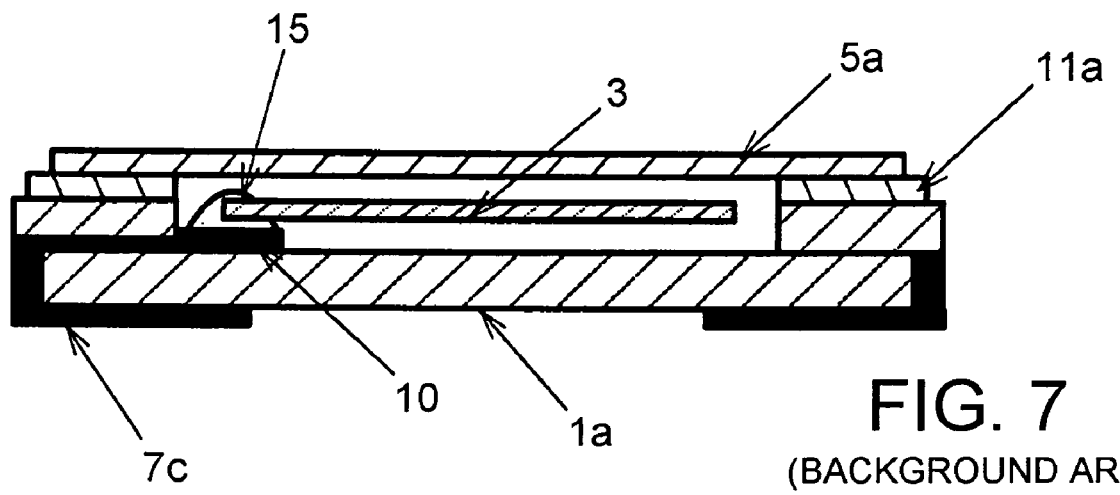
FIG. 7 is a cross-sectional view illustrating another example of a conventional surface mount type crystal unit.

The crystal unit illustrated in FIG. 18A is similar to the conventional crystal unit illustrated in FIG. 6, but differs from that illustrated in FIG. 6 in that pier 23 is disposed along the inner periphery of metal film 9 on the top surface of ceramic substrate 4 to form a step against the outer periphery portion. Step width W1 of the step is larger than frame width W2 of metal cover 5 including a flange on an open end face of metal cover 5. Then, pier 23 has a height (thickness) larger than a total thickness of metal film 9 and eutectic alloy 11.

In this example, metal film 9 is also produced by forming underlying electrodes of tungsten (W) or molybdenum (No) on a green ceramic sheet by printing, burning the ceramic sheet, and subsequently laminating an Ni layer and an Au layer on the underlying electrodes by plating. Then, pier 23 is formed when the underlying electrodes are formed, by printing multiple layers of W or Mo, which is the same material as the underlying electrodes, only on the inner peripheral side of the underlying electrodes. After burning, an Ni and an Au layer are laminated on the surface including the side surface of pier 23 by plating in a manner similar to metal film 9.

In this embodiment, after crystal blank 3 has been secured to crystal holding terminals 10, the open end face of metal cover 5 including the flange is brought into contact with eutectic alloy 11 disposed on metal film 9, and metal cover 5 is bonded to ceramic substrate 4 by melting eutectic alloy 11 by heating, thereby hermetically sealing crystal blank 3 and completing the crystal unit.

In the configuration as described above, the step formed by pier 23 on the inner peripheral side of metal film 9 can prevent metal cover 5 from shifting in position when it is bonded by eutectic alloy 11. It is therefore possible to ensure a sufficient seal-path between metal cover 5 and ceramic substrate 4 to increase the bonding strength and air-tight sealing. Particularly, in this example, since the Ni layer and Au layer are laminated on the top and side surfaces of pier 23 in a manner similar to metal film 9, eutectic alloy 11 introduces into a gap between metal cover 5 and pier 23 when it is melted by heating for bonding. In this way, a bonding area with eutectic alloy 11 extends to increase the seal-path, resulting in further increased bonding strength and air-tight sealing. Conversely, since the bonding strength and air-tight sealing can be kept high, the flange may be protruded by a shorter length on metal cover 5 to substantially increase the internal volume of the hermetic package.

Also, since frame width W2 of the opening end face of metal cover 5 is made smaller than W2 in consideration of a clearance for step width W1 of the step, the outer periphery of metal cover 5 will not protrude outward from ceramic substrate 4. Consequently, the surface mount type crystal unit satisfies criteria for outer dimensions without fail.

In the foregoing example, pier 23 for forming the step is created by printing multiple layers of the same materials as the underlying electrodes, but pier 23 may be made of an insulating material such as alumina instead of the materials of the underlying electrodes. While pier 23 is formed to make a round on ceramic substrate 4 along metal film 9, the pier 23 is not necessarily so formed. Pier 23 may be locally formed on each of four sides of ceramic substrate 4. Alternatively, L-shaped piers may be formed at a pair of corners on both sides of one diagonal of ceramic substrate 4. Pier 23 may be disposed in whichever manner as long as it has a height larger than the total thickness of metal film 9 and eutectic alloy 11 to have the ability to position metal cover 5.

Figure 18B:
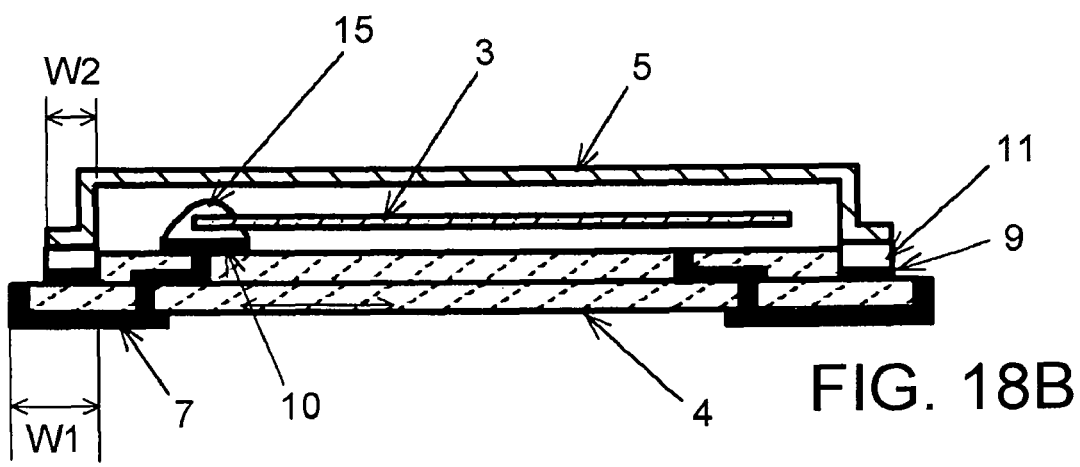

From a viewpoint of the positioning of metal cover 5, any step may be formed, and the step need not be created by a pier. FIG. 18B illustrates ceramic substrate 4 composed of laminated ceramic layers, the second layer of which is formed smaller than the first layer to create a step, instead of forming a pier. In this event, metal film 9 may be formed on an exposed surface of the first ceramic layer. Such ceramic substrate 4 can be formed by laminating a second green ceramic sheet divided into individual crystal oscillators on a first green ceramic sheet having an area corresponding to a plurality of crystal oscillators, burning the resulting laminate, and dividing the first ceramic sheet.

Figure 18C:
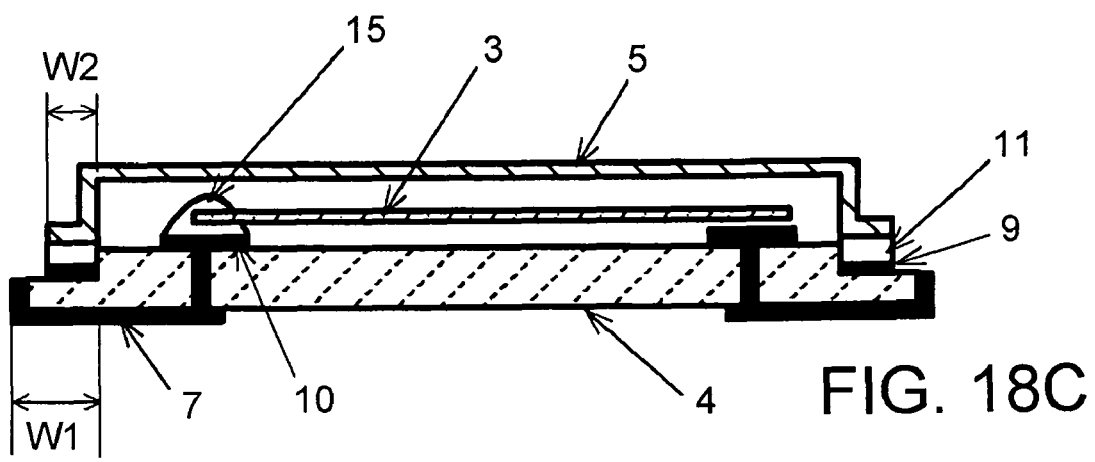

Alternatively, a single green ceramic sheet may be formed with mark-off lines, which run vertically and horizontally, by embossing, burned, and then cut vertically and horizontally along the mark-off lines for formation into ceramic substrates 4, each of which has a step on the outer periphery, as illustrated in FIG. 18C. In this event, crystal holding terminals 10 for holding crystal blank 3 are connected to mounting electrodes 7 through linear via-holes which extend through ceramic substrate 4, thereby maintaining the air-tight sealing.

In the configurations illustrated in FIGS. 18B and 18C, the step is preferably made to have larger width W1 to prevent mounting electrodes 7 from short-circuiting with metal film 9. However, for facilitating a reduction in size, the crystal unit may not include end face electrodes, each of which extends from associated mounting electrode 7.

Figure 19A:
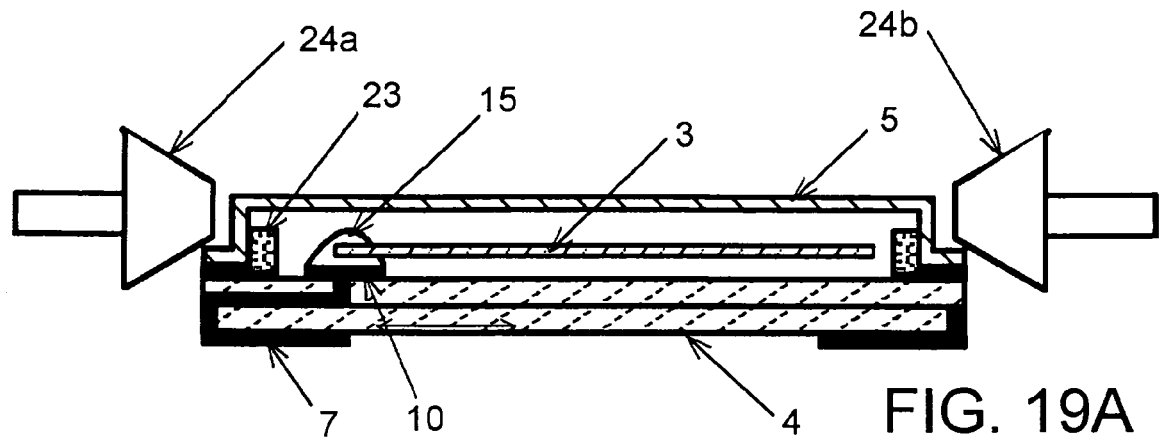
FIGS. 19A and 19B are cross-sectional views each for describing a method of bonding a metal cover to a ceramic substrate.
Figure 19B:
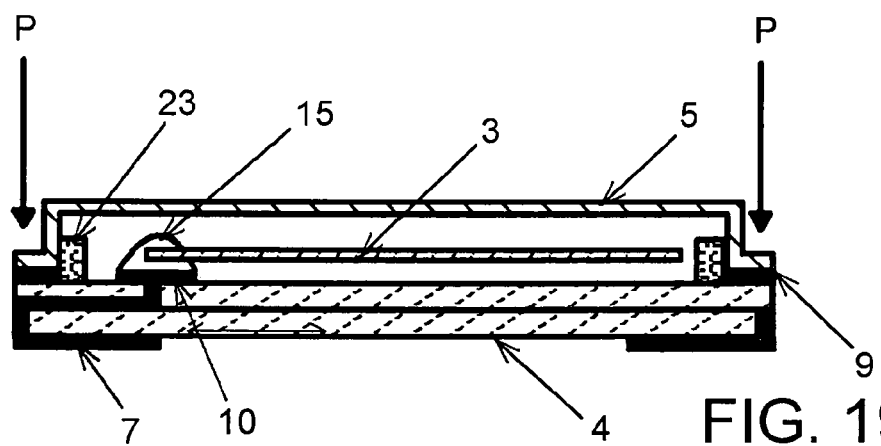

The bonding of metal cover 5 to ceramic substrate 4 is not limited to a method which is based on a eutectic alloy. For example, as illustrated in FIG. 19A, the bonding may be carried out by seam welding which involves bringing electrode rollers 24a, 24b into contact with the flange of metal cover 5, and bonding metal cover 5 to metal film 9. Alternatively, as illustrated in FIG. 19B, the bonding may be carried out by electron beam welding which involves irradiating the flange with electron beam P to bond metal cover 5 to metal film 9. Since neither the seam welding nor electron beam welding uses a eutectic alloy, the manufacturing cost can be more reduced for mass-produced items.

Figure 20:
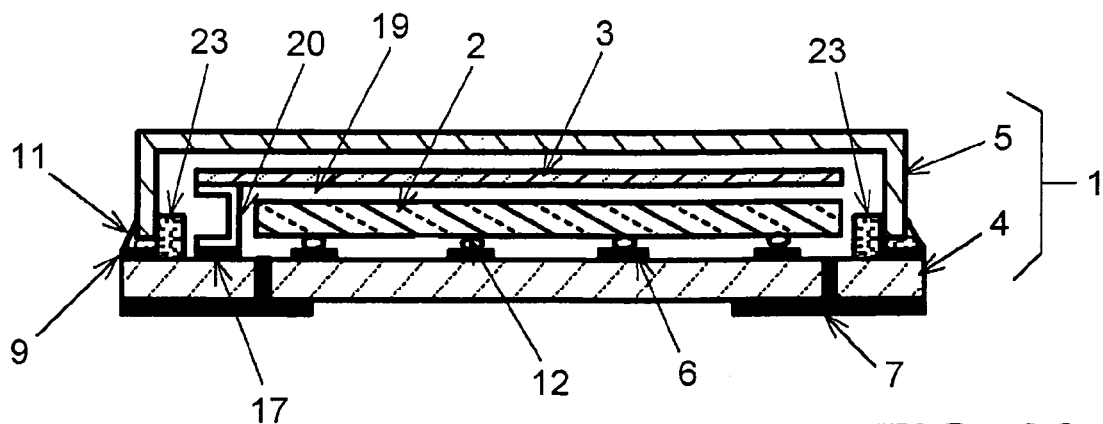
FIG. 20 is a cross-sectional view of a surface mount type crystal oscillator based on the present invention.

While the crystal devices based on the present invention have been described in connection of exemplary crystal units, each of which has a crystal blank hermetically sealed in a package, the present invention can also be applied to surface mount type crystal oscillators. FIG. 20 illustrates that metal cover 5 can be positioned by piers 23 provided in the aforementioned crystal oscillator illustrated in FIG. 8.

What is claimed is:

1. A surface mount type crystal oscillator comprising a crystal blank, an IC chip having at least an oscillation circuit using said crystal blank, integrated thereon, and a hermetic package for accommodating said crystal blank and said IC chip therein, wherein:
- said hermetic package comprises a ceramic substrate having a substantially rectangular shape and formed with a metal film which makes a round on one main surface thereof, and a concave metal cover having an open end face bonded to said metal film,
- said ceramic substrate comprises mounting electrodes at corners on the other main surface of said ceramic substrate for use in mounting said crystal oscillator on a wiring board,
- said IC chip is secured to the one main surface of said ceramic substrate through ultrasonic thermo-compression bonding using bumps,
- said crystal blank is disposed above said IC chip, and
- said one main surface of said ceramic substrate is formed as a flat surface,
- wherein said ceramic substrate comprises a first ceramic layer formed with said mounting electrodes, and a second ceramic layer laminated on said first ceramic layer for securing said IC chip thereto,
- said first ceramic layer comprises a cutout portion in a central area of each side thereof, said cutout portion having an outer periphery open to said side,
- an adjustment terminal is formed on a laminated surface of said second ceramic layer exposed by each said cutout portion, and
- said adjustment terminals include a pair of write surface terminals used to write temperature compensation data into a temperature compensation mechanism within said IC chip, and a pair of crystal test terminals used to measure oscillation characteristics of said crystal blank.

2. The crystal oscillator according to claim 1, wherein said other main surface of said ceramic substrate is formed as a flat surface.

3. The crystal oscillator according to claim 1, further comprising a supporter having one end bonded to the one main surface of said ceramic substrate, and the other end adapted to support said crystal blank thereon.

4. A surface mount type crystal oscillator comprising a crystal blank, an IC chip having at least an oscillation circuit using said crystal blank, integrated thereon, and a package having at least a substantially rectangular ceramic substrate and adapted to accommodate said crystal blank and said IC chip therein, wherein:
- said ceramic substrate comprises mounting electrodes at corners on a surface thereof which is an outer bottom surface of said package for use in mounting said crystal oscillator on a wiring board,
- said ceramic substrate comprises a first ceramic layer formed with said mounting electrodes, and a second ceramic layer laminated on said first ceramic layer for securing said IC chip thereto,
- said first ceramic layer comprises a cutout portion in a central area on at least one side thereof, said cutout portion having an outer periphery open to said side, and
- an adjustment terminal is formed on a laminated surface of said second ceramic layer exposed by said cutout portion,
- wherein said first ceramic layer comprises said cutout portion in a central area of each side thereof, and said adjustment terminals include a pair of write surface terminals used to write temperature compensation data into a temperature compensation mechanism within said IC chip, and a pair of crystal test terminals used to measure oscillation characteristics of said crystal blank.

\* \* \* \* \*